US009281039B2

(12) United States Patent (10) Patent No.: US 9,281,039 B2
Jung et al. (45) Date of Patent: Mar. 8, 2016

(54) SYSTEM AND METHOD TO PROVIDE A REFERENCE CELL USING MAGNETIC TUNNEL JUNCTION CELLS

(71) Applicant: QUALCOMM Incorporated, San Diego, CA (US)

(72) Inventors: Seong-Ook Jung, Gyeongggi-Do (KR); Taehui Na, Seoul (KR); Jisu Kim, San Diego, CA (US); Jung Pill Kim, San Diego, CA (US); Seung H. Kang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 96 days.

(21) Appl. No.: 13/953,771

(22) Filed: Jul. 30, 2013

(65) Prior Publication Data

US 2015/0036409 A1   Feb. 5, 2015

(51) Int. Cl.
*G11C 11/15* (2006.01)
*G11C 11/16* (2006.01)
*H01L 43/02* (2006.01)

(52) U.S. Cl.
CPC .......... *G11C 11/161* (2013.01); *G11C 11/1673* (2013.01); *H01L 43/02* (2013.01)

(58) Field of Classification Search
CPC ................................ G11C 11/15; G11C 11/16
USPC .................................. 365/173, 210, 158, 148
See application file for complete search history.

(56) References Cited

U.S. PATENT DOCUMENTS

| | | | |
|---|---|---|---|
| 6,445,612 B1 | 9/2002 | Naji | |
| 6,697,294 B1 * | 2/2004 | Qi et al. | 365/210.15 |
| 6,946,882 B2 | 9/2005 | Gogl et al. | |
| 7,449,314 B2 | 11/2008 | Grae | |
| 8,154,903 B2 | 4/2012 | Jung et al. | |
| 8,274,819 B2 | 9/2012 | Yang | |
| 8,730,718 B2 | 5/2014 | Liu | |
| 2009/0201717 A1 * | 8/2009 | Maeda et al. | 365/148 |
| 2010/0208511 A1 | 8/2010 | Rhie et al. | |
| 2011/0194333 A1 * | 8/2011 | Kim et al. | 365/158 |
| 2011/0235391 A1 | 9/2011 | Kim et al. | |
| 2011/0285594 A1 | 11/2011 | Chang | |
| 2012/0057400 A1 | 3/2012 | Kim et al. | |
| 2013/0016553 A1 * | 1/2013 | Rao et al. | 365/158 |

OTHER PUBLICATIONS

Lee S.Y., et al., "A New Reference Cell for 1T-1MTJ MRAM," Journal of Semiconductor Technology and Science, Jun. 2004, vol. 4 (2), pp. 110-116.
International Search Report and Written Opinion for International Application No. PCT/US2014/047040, ISA/EPO, Date of Mailing Dec. 15, 2014, 14 pages.
Kimura, H., et al., "A Study of Multiple-Valued Magnetoresistive RAM (MRAM) Using Binary MTJ Devices," 34th International Symposium on Multiple-Valued Logic, Proceedings, May 2004, IEEE, Piscataway, NJ, pp. 340-345.
Chung, S., et al., "Fully integrated 54nm STT-RAM with the smallest bit cell dimension for high density memory application," IEEE International Electron Devices Meeting (IEDM), 2010, IEEE, Piscataway, NJ, pp. 12.7.1-12.7.4.

* cited by examiner

*Primary Examiner* — Hoai V Ho
*Assistant Examiner* — Minh Dinh
(74) *Attorney, Agent, or Firm* — Toler Law Group, PC

(57) ABSTRACT

An apparatus includes a group of data cells and a reference cell coupled to the group of data cells. The reference cell includes four magnetic tunnel junction (MTJ) cells.

31 Claims, 10 Drawing Sheets

SYSTEM AND METHOD TO PROVIDE A REFERENCE CELL USING MAGNETIC TUNNEL JUNCTION CELLS

I. FIELD

The present disclosure is generally related to reference cells.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

An electronic device (e.g., a wireless phone or a computing device) may include a magnetoresistive random-access memory (MRAM) device as a component. A MRAM device is a memory device that stores data using a plurality of magnetic storage elements. An example of a magnetic storage element is a magnetic tunnel junction (MTJ) element. A spin transfer torque (STT) MTJ element may store data by using a current to align an orientation of a magnetic element of a free magnetic layer of the MTJ element relative to a fixed magnetic layer of the MTJ element. For example, when the free magnetic layer has the same orientation as the fixed magnetic layer, the MTJ element may have a first resistance value. The first resistance value may represent a particular logic state (e.g., logic 0). When the free magnetic layer has a different orientation from the fixed magnetic layer, the MTJ element may have a second resistance value. The second resistance value may represent another particular logic state (e.g., logic 1). When the MTJ element is read, the first resistance value may correspond to a first voltage value that indicates the particular logic state, and the second resistance value may correspond to a second voltage value that indicates the other logic state.

To read a logic state stored in an MRAM, a particular MTJ element of the MRAM may be selected via a word line, and a current may be generated to pass through the particular MTJ element via a bit line. The current that passes through the particular MTJ element may be compared to a reference current using a sense amplifier circuit to determine the stored logic state. Alternatively, the current may be converted to a voltage and the voltage may be compared a reference voltage to determine the stored logic state.

A reference circuit may implement a current mean scheme to provide a reference current or the reference circuit may implement a resistance mean scheme to provide a reference voltage. However, a conventional current mean scheme implementation may suffer from parasitic mismatch and uses two reference current branches. A conventional current mean scheme implementation occupies more area on a circuit board as compared to a reference circuit implementing a resistance mean scheme. Alternatively, a conventional resistance mean scheme implementation uses more current to perform a write operation as compared to a conventional current-mean scheme because the typical resistance mean scheme implementation uses serially coupled MTJ elements in a write current path.

III. SUMMARY

A reference circuit implements a reference mean scheme using magnetic tunnel junction (MTJ) cells. Using MTJ cells in a reference circuit that implements a reference mean scheme may reduce parasitic mismatch and may occupy less space on a circuit board as compared to a conventional current mean scheme implementation. Further, using the MTJ cells in a reference mean scheme implementation may reduce current consumption during a write operation as compared to a conventional reference mean implementation.

For example, a memory array may include a plurality of data columns. Each data column may include a plurality of data cells. Each data column may be coupled to a distinct bit line and a distinct source line. The memory array may also include a reference cell (e.g., a reference circuit that provides a reference voltage). The reference cell may include four MTJ cells. Each of the four MTJ cells may have the same structure (or substantially the same structure) as a data cell of the data column. In a particular illustrative embodiment, each of the four MTJ cells and the plurality of data cell are implemented using a single transistor coupled to a single MTJ element. In another particular illustrative embodiment, each of the four MTJ cells and the plurality of data cell are implemented using two transistors coupled to a single MTJ element.

The four MTJ cells may be interconnected so that the reference cell is coupled to only one bit line. For example, the first MTJ cell may be coupled to the second MTJ cell via a first electrical connection. The second MTJ cell may be coupled to the third MTJ cell via a second electrical connection. The third MTJ cell may be coupled to a fourth MTJ cell via a third electrical connection and the fourth MTJ cell may be coupled to the first MTJ cell via a fourth electrical connection. The first MTJ cell and the fourth MTJ cell may be coupled to a bit line via a common node. The reference cell that includes the four MTJ cells may be part of an apparatus (e.g., a memory array). As an example, in a particular embodiment, an apparatus includes a group of data cells and a reference cell that is coupled to the group of data cells. The reference cell includes four magnetic tunnel junction (MTJ) cells.

The reference cell may be activated to generate a reference voltage. As an example, in a particular embodiment, a method includes activating a reference cell of a first memory array via a first word line. The method also includes applying a reference current to the reference cell to generate a reference voltage, where the reference current passes through four magnetic tunnel junction (MTJ) cells of the reference cell.

One particular advantage provided by at least one of the disclosed embodiments is an ability to provide a reference voltage from a reference cell that has reduced parasitic mismatch and that uses less current to perform a write operation as compared to a conventional resistance mean scheme implementation. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
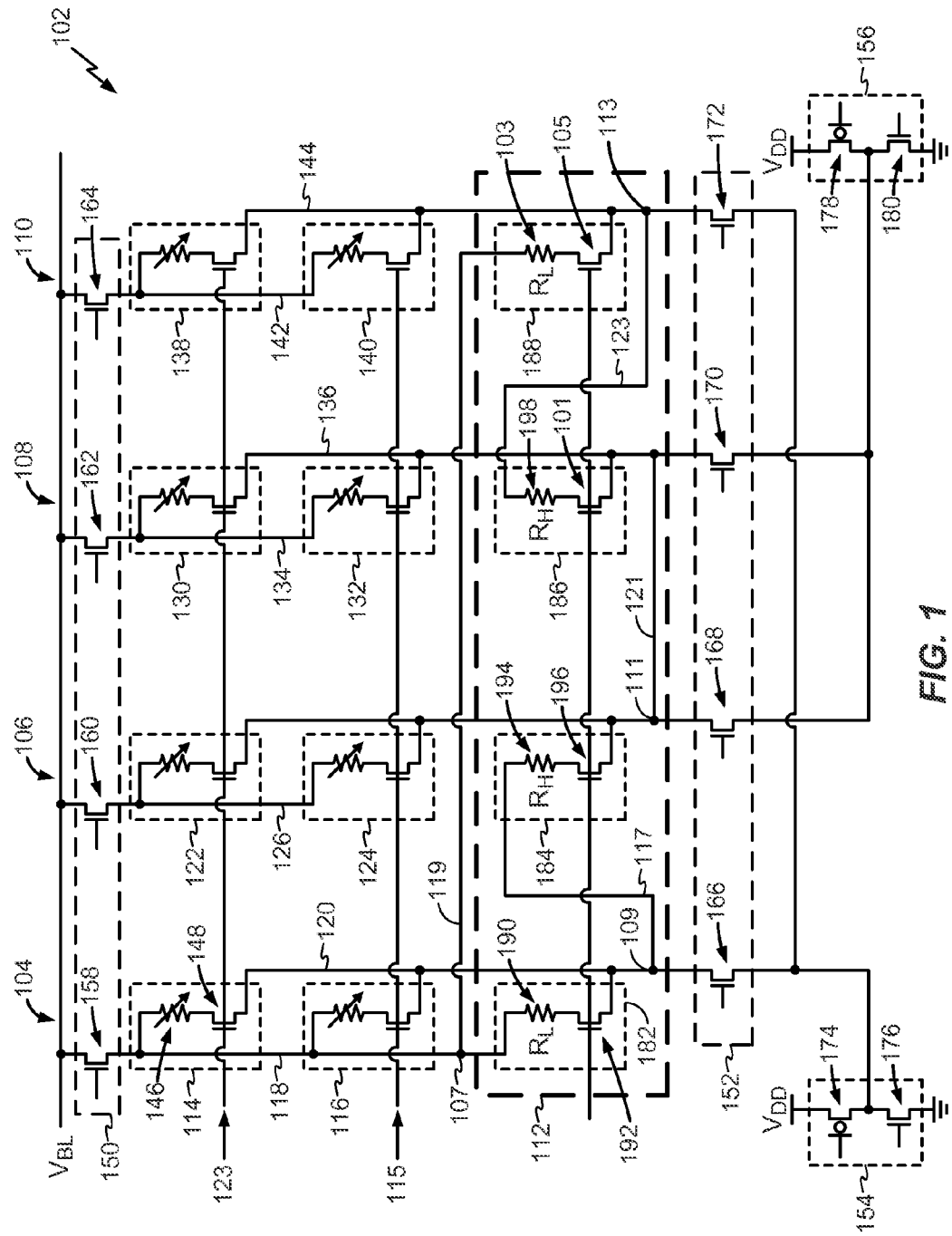
FIG. 1 is a diagram of a particular embodiment of a magnetoresistive random-access memory (MRAM) device that includes a reference cell with four magnetic tunnel junction (MTJ) cells.

FIG. 1 illustrates a particular embodiment of a magnetoresistive random-access memory (MRAM) device 102 that includes a reference cell 112 with four magnetic tunnel junction (MTJ) cells. The MRAM device 102 may include a memory array or a memory bank. The MRAM device 102 may include a plurality of data columns 104, 106, 108, 110. Each of the data columns 104-110 may include a plurality of data cells, each data cell coupled to a distinct bit line and to a distinct source line. For example, the data column 104 may include data cells 114, 116. The data cells 114, 116 may be coupled to a bit line 118 and to a source line 120. The data column 106 may include data cells 122, 124 that are coupled to a bit line 126 and to a source line 128. The data column 108 may include data cells 130, 132 that are coupled to a bit line 134 and to a source line 136. The data column 110 may include data cells 138, 140 that are coupled to a bit line 142 and to a source line 144.

Each of the data cells may be an MTJ cell and may be configured to store a logic state (e.g., logic 0 or logic 1) using an MTJ element. The data cells may be implemented using the same components or circuitry. In a particular embodiment, each of the data cells may be implemented using an MTJ element coupled to a single transistor. For example, the data cell 114 may be implemented using an MTJ element 146 that is coupled to a transistor 148. The data cells 114, 122, 130, and 138 may be activated by a word line 123. The data cells 116, 124, 132, and 140 may be activated by a word line 115.

The MRAM device 102 may also include a bit line multiplexer 150, a source line multiplexer 152, and source line drivers 154, 156. The source line multiplexer 152 may be configured to selectively provide connections between the source line drivers 154, 156 and the data columns 104-110. The source line multiplexer 152 may include a plurality of transistors 166, 168, 170, 172. The data columns 104-110 may be coupled to the bit line multiplexer 150 and to the source line multiplexer 152. The source line driver 154 may be coupled to the source line 120 of the data column 104 via the transistor 166 and to the source line 144 of the data column 110 via the transistor 172. The source line driver 156 may be coupled to the source line 128 of the data column 106 via the transistor 168 of the source line multiplexer 152 and to the source line 136 of the data column 108 via the transistor 170. The source line multiplexer 152 may be positioned closer to the reference cell 112 as compared to the bit line multiplexer 150.

The bit line multiplexer 150 may be configured to selectively enable a current to pass through at least one of the data columns 104-110. For example, the bit line multiplexer 150 may include a plurality of transistors 158, 160, 162, 164. Each of the transistors 158-164 may selectively couple a distinct data column to a voltage source VBL. For example, the transistor 158 may selectively couple the bit line 118 of the data column 104 to the voltage source VBL. As another example, the transistor 160 may selectively couple the bit line 126 of the data column 106 to the voltage source VBL.

The source line drivers 154, 156 may be implemented using the same components or circuitry (e.g., identical designs may be used for circuit elements of the source line drivers 154, 156). In a particular embodiment, each of the source line drivers 154, 156 may be implemented using a p-type metal-oxide-semiconductor field-effect transistor (MOSFET) coupled an n-type MOSFET in an inverter-type configuration. For example, the source line driver 154 may be implemented using a p-type MOSFET 174 coupled to an n-type MOSFET 176. The source line driver 156 may be implemented using a p-type MOSFET 178 coupled to an n-type MOSFET 180.

The reference cell 112 may be coupled to only one of the data columns 104-110. For example, the reference cell 112 may be coupled to the data column 104 and not coupled to the data columns 106-110. One reference cell may be provided for every four data columns. The reference cell 112 may include four MTJ cells 182, 184, 186, 188. The MTJ cells 182-188 may have the same structure as the data cells. For example, the MTJ cell 182 may be implemented using an MTJ element 190 coupled to a single transistor 192. The MTJ cell 184 may be implemented using an MTJ element 194 coupled to a single transistor 196. The MTJ cell 186 may be implemented using an MTJ element 198 coupled to a single transistor 101. The MTJ cell 188 may be implemented using an MTJ element 103 coupled to a single transistor 105. The MTJ cells 182-188 may be interconnected. For example, the MTJ cell 182 may be coupled to the data column 104 at a node 107. The MTJ cell 188 may also be coupled to the data column 104 at the node 107 via an electrical connection 119. The MTJ cell 182 may be coupled to the MTJ cell 184 at a node 109 via an electrical connection 117. The MTJ cell 184 may be coupled to the MTJ cell 186 at a node 111 via an electrical connection 121. The MTJ cell 186 may be coupled to the MTJ cell 188 at a node 113 via an electrical connection 123.

The reference cell 112 may implement a resistance mean scheme to provide a reference voltage. To implement the resistance mean scheme, the reference cell 112 may have a particular resistance value (e.g., a resistance mean) that is centered between a resistance value corresponding to a logic 0 value and a resistance value corresponding to a logic 1 value. For example, the MTJ elements 190, 103 may be programmed to have a first resistance value RL. The first resistance value RL may indicate that a logic 0 value is stored at the MTJ elements 190, 103. The MTJ elements 194, 198 may be programmed to have a second resistance value RH. The second resistance value RH may indicate that a logic 1 value is stored at the MTJ elements 194, 198. A resistance mean value RM of the reference cell 112 may be given by:

$$RM=(RL+RH)/2$$

Utilizing MTJ cells 182-188 that have the same structure as the data cells 114-140 may enable the reference cell 112 to more accurately mimic electrical responses of the data cells to a signal (e.g., a voltage signal or a current signal) and to experience similar process, voltage, and temperature variations as the data cells. Thus, the reference cell 112 may have a more accurate resistance mean value as compared to a resistance mean value of a reference cell that has a different structure than the data cells 114-140. As a result, a more accurate reference voltage may be generated and a sense amplifier may more accurately determine a logic state stored in a data cell.

During a read operation, a reference current may pass through the reference cell 112 to generate a reference voltage. A data current may be applied to a data cell of a second memory array to generate a data voltage. The reference voltage and the data voltage may be compared by a sense amplifier to determine a logic state of the data cell of the second memory array. The read operation of the reference cell 112 is described in more detail with reference to FIG. 2. During a write operation, the MTJ elements 190, 194, 198, 103 may be programmed via programming currents to their respective resistance values. The write operation of the reference cell 112 is described in more detail with reference to FIG. 3. Thus, the reference cell 112 may have reduced parasitic mismatch and may use less current to perform a write operation as compared to a conventional resistance mean scheme implementation.

Figure 5:
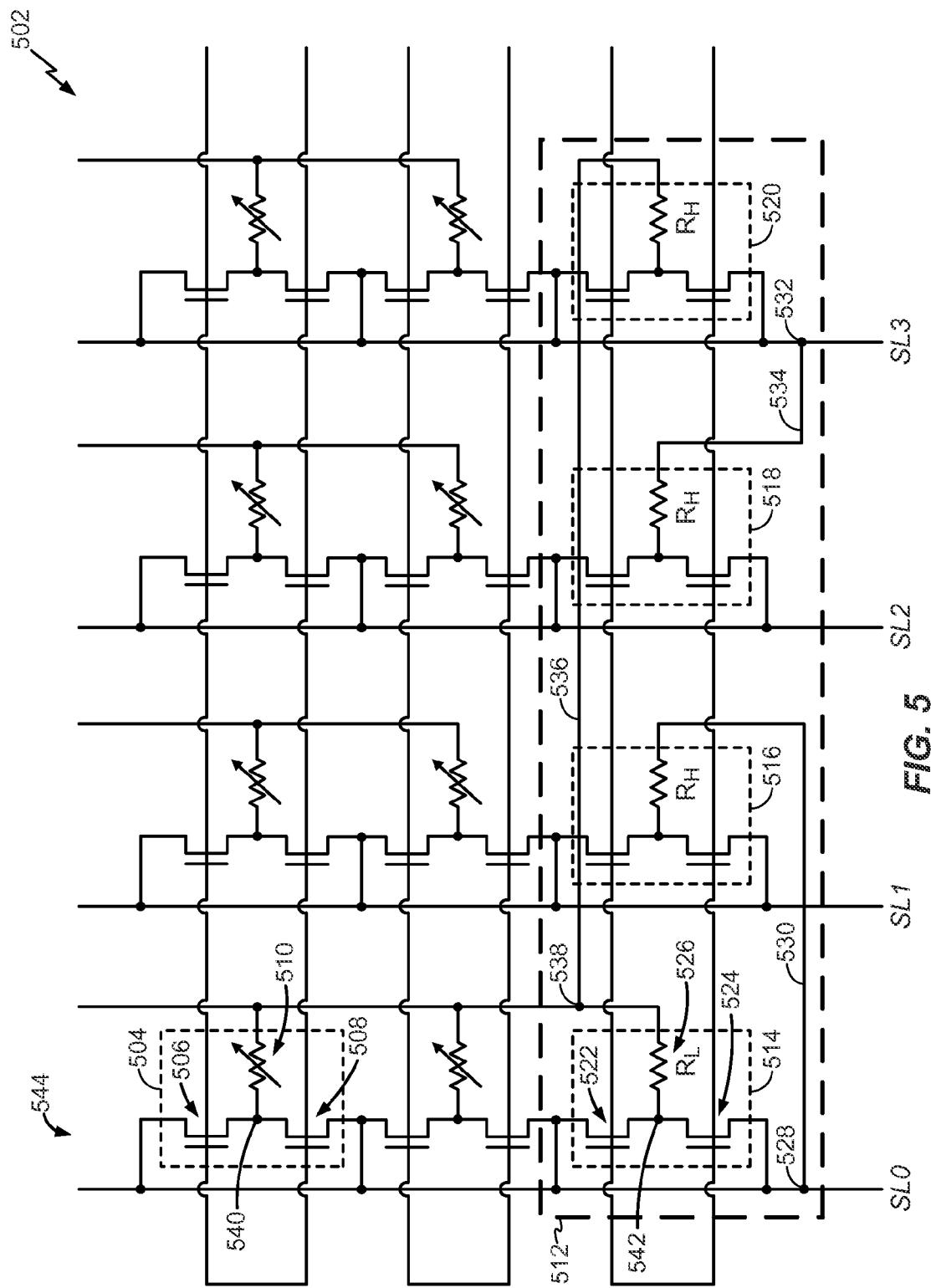
FIG. 5 is a diagram of another particular embodiment of a MRAM device that includes a reference cell with four MTJ cells.
Figure 6:
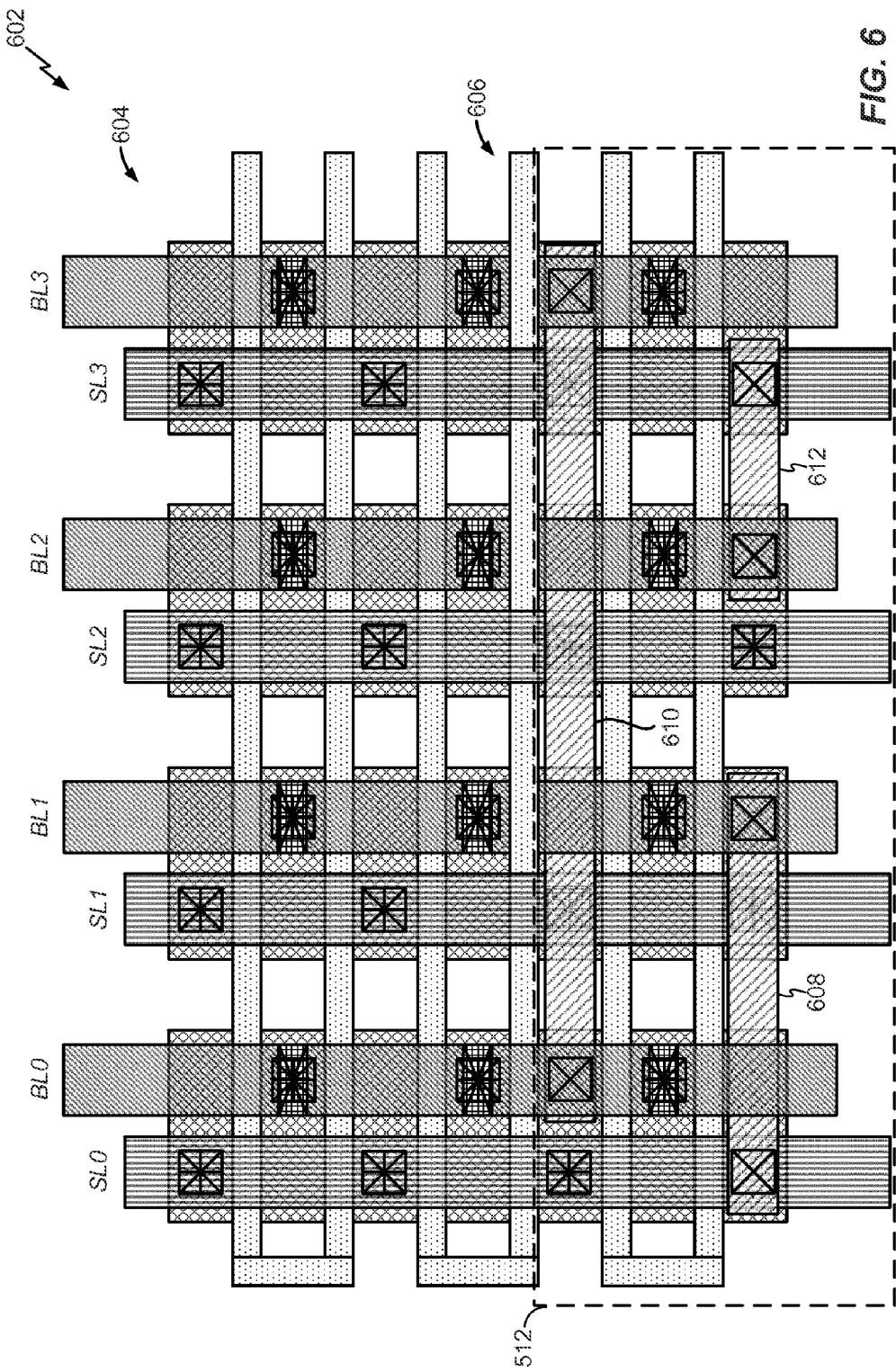
FIG. 6 is a diagram of a layout of the MRAM device of FIG. 5.

Although FIG. 1 illustrates MTJ cells 182-188 in a 1T1MTJ (one transistor, one MTJ element) configuration, in another particular embodiment, the data cells 114-140 and each MTJ cell 182-188 may be implemented using two transistors coupled to an MTJ element, such as described in further detail with respective to FIGS. 5-6.

Figure 2:
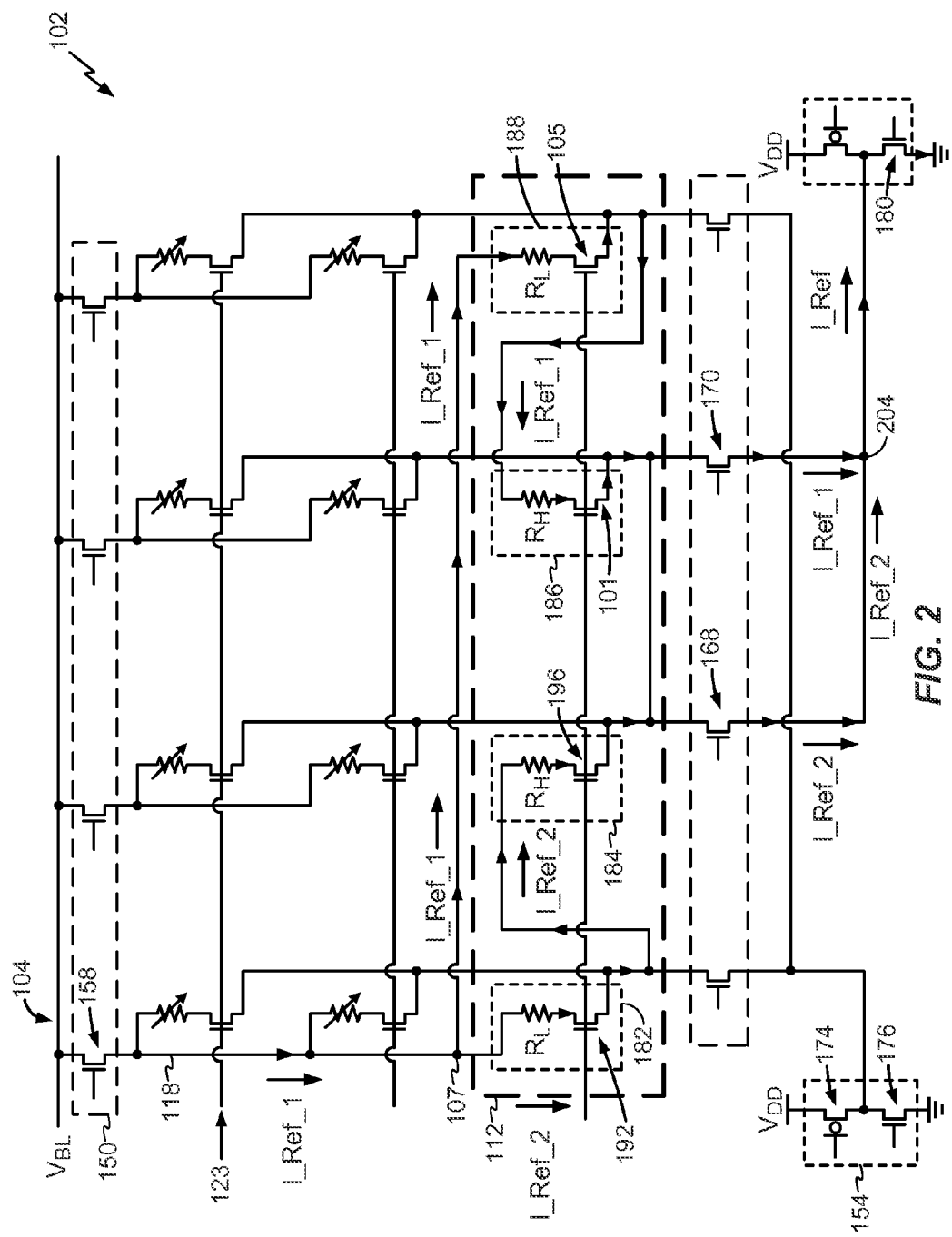
FIG. 2 is a diagram that illustrates current flow of a read operation of the reference cell of FIG. 1.

FIG. 2 illustrates current flow of a read operation of the reference cell 112 of FIG. 1. When a particular data column of another MRAM device (e.g., in another bank of a memory) is read, the reference cell 112 may be activated via a reference word line 202 to generate a reference voltage for a sense amplifier to determine logic states stored in the particular data column. For example, the reference word line 202 may turn on the transistors 192, 196, 101, 105 to activate the reference cell 112. During the read operation, the transistors 158, 168, 170 may be turned on to provide a current path. The voltage source VBL may apply a voltage to the data column 104 to generate a reference current I_Ref. The reference current I_Ref may pass through the bit line 118 and may split into two separate currents, I_Ref_1 and I_Ref_2, at the node 107. The current I_Ref_1 may pass through the MTJ cells 188, 186 and through the transistor 170 in a first path. The current I_Ref_2 may pass through the MTJ cells 182, 184 and the transistor 168 in a second path. The currents I_Ref_1 and I_Ref_2 may merge at a node 204 to form the reference current I_Ref. The reference current I_Ref may flow to ground via the n-type MOSFET 180. By passing the reference current I_Ref through the reference cell 112, a reference voltage may be generated, and the reference voltage may be used by the sense amplifier.

Figure 3:
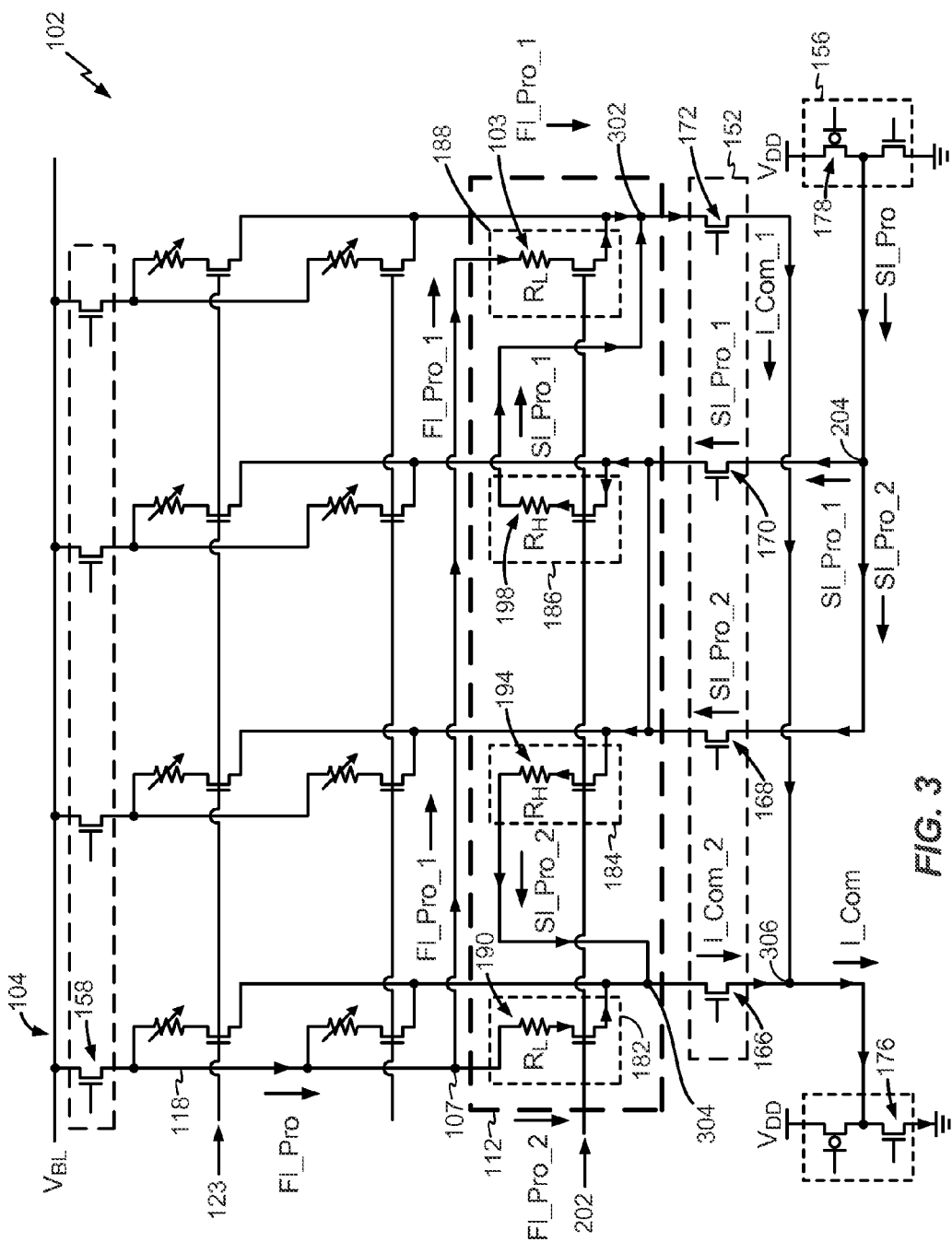
FIG. 3 is a diagram that illustrates current flow of a write operation of the reference cell of FIG. 1.

FIG. 3 illustrates current flow of a write operation of the reference cell 112 of FIG. 1. During a write operation, the MTJ elements 190, 194, 198, 103 may be programmed via programming currents to have different resistance values. The reference cell 112 may be activated via the reference word line 202 so that the MTJ elements 190, 194, 198, 103 may be programmed. During the write operation, the transistors 158, 166, 168, 170, 172, 176, and the p-type MOSFET 178 may be turned on to provide paths for the programming currents. A first programming current FI_Pro may be generated by applying a first voltage to the data column 104. The first programming current FI_Pro may split into two currents, FI_Pro_1 and FI_Pro_2, at the node 107. For example, the current FI_Pro_2 may pass through the MTJ cell 182 to program the MTJ element 190 via a first path. The current FI_Pro_1 may pass through the MTJ cell 188 to program the MTJ element 103 via a second path.

A second programming current SI_Pro may be generated by applying a second voltage to the source line driver 156. The second programming current SI_Pro may split into two currents, SI_Pro_1 and SI_Pro_2, at the node 204. For example, the current SI_Pro_2 may pass through the MTJ cell 184 to program the MTJ element 194 via a third path. The current SI_Pro_1 may pass through the MTJ cell 186 to program the MTJ element 198 via a fourth path. The currents FI_Pro_1 and SI_Pro_1 may merge at a node 302 to form a first combined current I_Com_1. The currents FI_Pro_2 and SI_Pro_2 may merge at a node 304 to form a second combined current I_Com_2. The first combined current I_Com_1 and the second combined current I_Com_2 may merge at a node 306 to form a combined current I_Com. The combined current I_Com may flow to ground through the n-type MOSFET 176. By programming each of the MTJ elements 190, 194, 198, 103 via a distinct path, an amount of current used to program each of MTJ elements 190, 194, 198, 103 is reduced as compared to a write operation of a conventional resistance mean scheme implementation (i.e., when a single current programs multiple MTJ cells in series) as no more than one MTJ element is programmed via each path in the reference cell 112.

Figure 4:
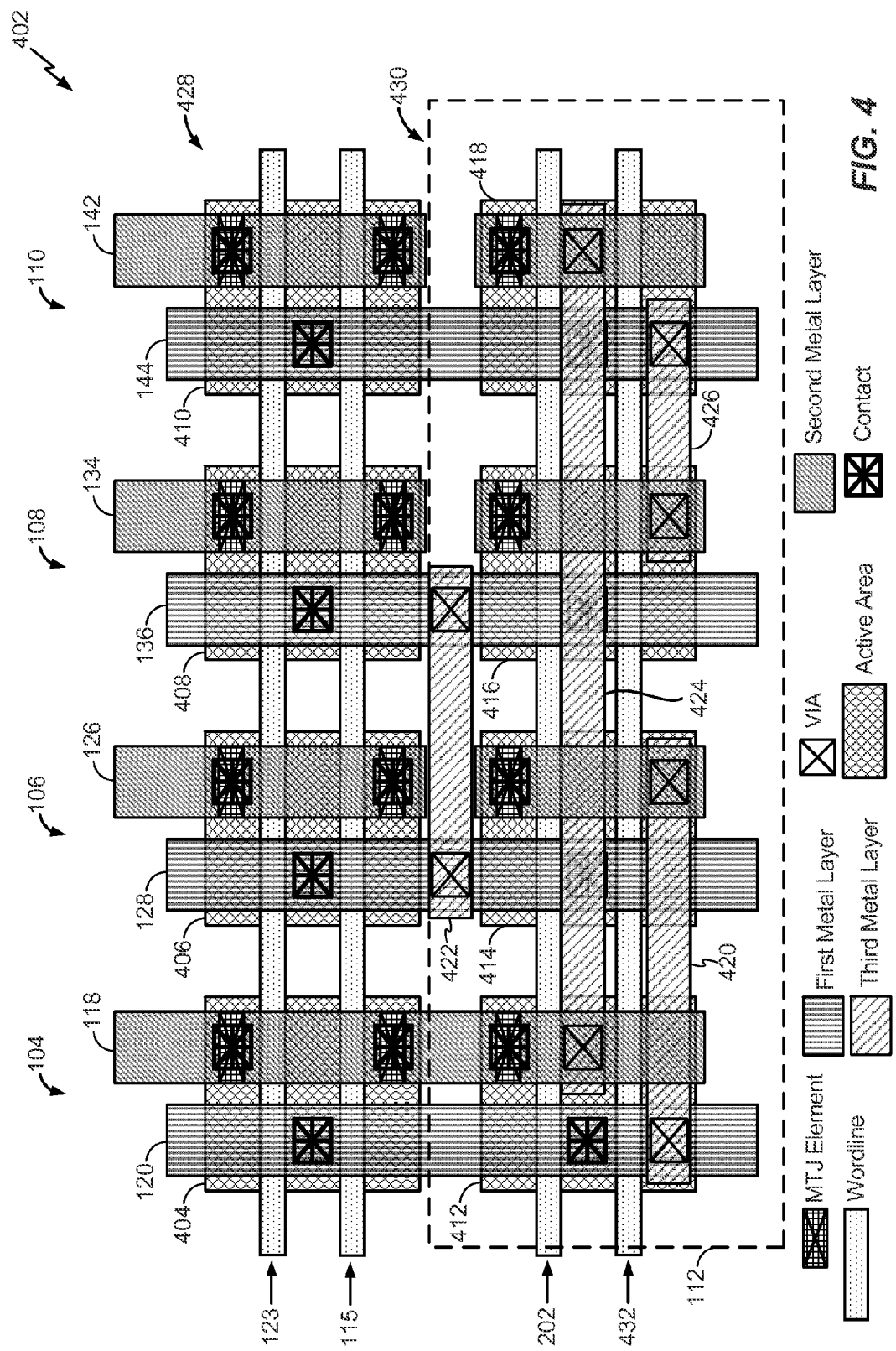
FIG. 4 is a diagram of a layout of the MRAM device of FIG. 1.

FIG. 4 illustrates a layout 402 of the MRAM device 102 of FIG. 1. The layout 402 includes a layout 428 of the data cells 114-140 and a layout 430 of the reference cell 112. The data cells 114-140 may be formed in active areas 404, 406, 408, 410 and the reference cell 112 may be formed in active areas 412, 414, 416, 418. The source lines 120, 128, 136, 144 may be formed on a first metal layer. The bit lines 118, 126, 134, 142 may be formed in a second metal layer. To match the layout 428 of the data cells 114-140 for symmetry, a dummy word line 432 may be formed on the second metal layer so that there are two word lines in each of the active areas 404-418.

As shown in FIG. 4, because MTJ cells of the reference cell 112 have the same structure as the data cells 114-140 as described in FIG. 1, the layout 430 of the reference cell 112 may be substantially similar to the layout 428 of the data cells 114-140. Four conductive paths 420, 422, 424, 426 may be added to the layout 430 to interconnect the MTJ cells 182-188. The conductive path 420 may correspond to the electrical connection 117. The conductive path 422 may correspond to the electrical connection 121. The conductive path 424 may correspond to the electrical connection 119. The conductive path 426 may correspond to the electrical connection 123. The similarity in layout reduces fabrication complexity of the MRAM device 102 and also enables the reference cell 112 to more accurately mimic electrical responses of the data cells 114-140 to a signal (e.g., a voltage signal or a current signal).

FIG. 5 illustrates another particular embodiment of a MRAM device 502 that includes a reference cell 512 with four MTJ cells. The MRAM device 502 and the reference cell 512 may be substantially similar to the MRAM device 102 and the reference cell 112, respectively. The MRAM device 502 may include a plurality of data cells. Each data cell of the MRAM device 502 may have a 2T1MTJ (two transistors, one MTJ element) configuration. For example, a data cell 504 may include a first transistor 506 coupled to a second transistor 508. A MTJ element 510 may be coupled to the first transistor 506 and to the second transistor 508 at a node 540.

The reference cell 512 may include four MTJ cells 514, 516, 518, 520. Each of the MTJ cells 514-520 may be in a 2T1MTJ configuration. For example, the MTJ cell 514 may include a third transistor 522 coupled to a fourth transistor 524. A MTJ element 526 may be coupled to the third transistor 522 and the fourth transistor 524 at a node 542. The MTJ cells 514-520 may be interconnected. For example, the MTJ cell 514 may be coupled to a data column 544 of the MRAM device 502 at a node 538. The MTJ cell 520 may also be coupled to the data column 544 at the node 538 via an electrical connection 536. The MTJ cell 516 may be coupled to the MTJ cell 514 at a node 528 via an electrical connection 530. The MTJ cell 518 may be coupled to the MTJ cell 520 at a node 532 via an electrical connection 534.

FIG. 6 illustrates a layout of the MRAM device 502 of FIG. 5. The layout 602 includes a layout 604 of the data cells (e.g., the data cell 504) of the MRAM device 502 and a layout 606 of the reference cell 512.

As shown in FIG. 5, because MTJ cells of the reference cell 512 have the same structure as the data cells of the MRAM device 502 as described in FIG. 4, the layout 606 of the reference cell 512 may be substantially similar to the layout 604 of the data cells of the MRAM device 502. Three conductive paths 608, 610, 612 may be added to the layout 606 to interconnect the MTJ cells 514-520. The conductive path 608 may correspond to the electrical connection 530. The conductive path 610 may correspond to the electrical connection 536. The conductive path 612 may correspond to the electrical connection 534. The similarity in layout reduces fabrication complexity of the MRAM device 502 and also enables the reference cell 512 to more accurately mimic electrical responses of the data cells of the MRAM device 502 to a signal (e.g., a voltage signal or a current signal).

Figure 7:
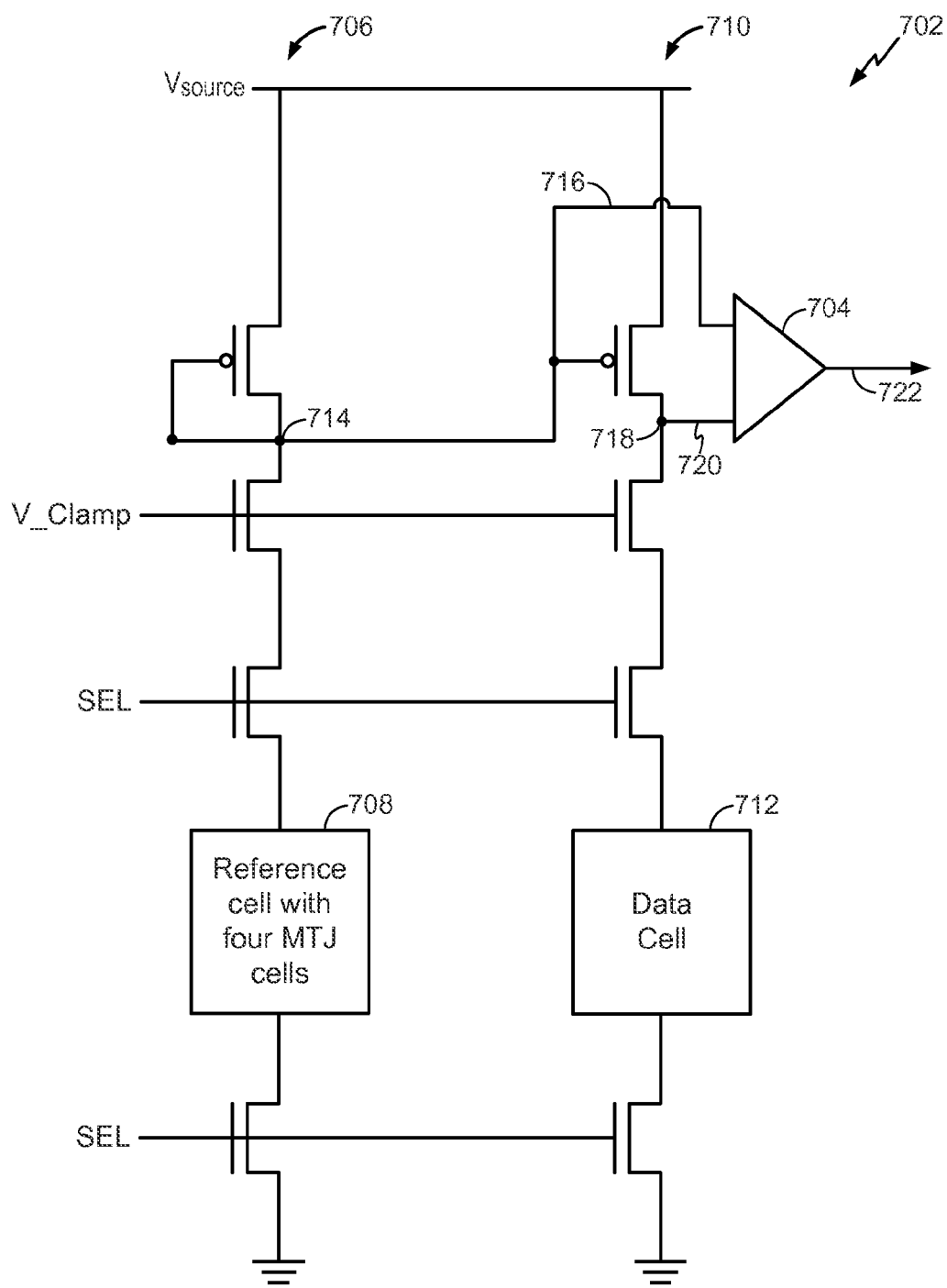
FIG. 7 is a diagram of a system that includes a reference cell with four MTJ cells to determine a logic state of a data cell.

FIG. 7 illustrates a system 702 that includes a reference cell (e.g., the reference cell 112 of FIG. 1, the reference cell 512 of FIG. 5) with four MTJ cells to determine a logic state of a data cell. The system 702 may include a sense amplifier 704 that is configured to determine a logic state of a data cell. The system 702 may also include a data column 706 that includes a reference cell 708. The reference cell 708 may include four MTJ cells (not shown). The system 702 may further include a data column 710 that includes a data cell 712. The data cell 712 may include an MTJ cell. In a particular embodiment, the reference cell 708 is the reference cell 112. In another particular embodiment, the reference cell 708 is the reference cell 512. In a particular embodiment, the data column 706 and the data column 710 are located in the same MRAM device. In another particular embodiment, the data column 706 and the data column 710 are located in different MRAM devices (e.g., separate banks of an MRAM).

During a read operation, a voltage source may apply a voltage to the data column 706 and another voltage to the data column 708. Based on the applied voltages and resistances of the reference cell 708 and the data cell 712, a reference voltage 716 may be generated and a data voltage 720 may be generated. The reference voltage 716 may correspond to a voltage generated by read current through the reference cell 708, and the data voltage 720 may correspond to a voltage generated by read current through the data cell 712.

The reference voltage 716 may be measured at a node 714 of the data column 706. The reference voltage 716 may be provided to the sense amplifier 704 as a first input. The data voltage 720 may be measured at a node 718 of the data column 710. The data voltage 720 may be provided to the sense amplifier 704 as a second input. The sense amplifier 704 may compare the data voltage 720 to the reference voltage 716 to determine a logic state of the data cell 712.

Figure 8:
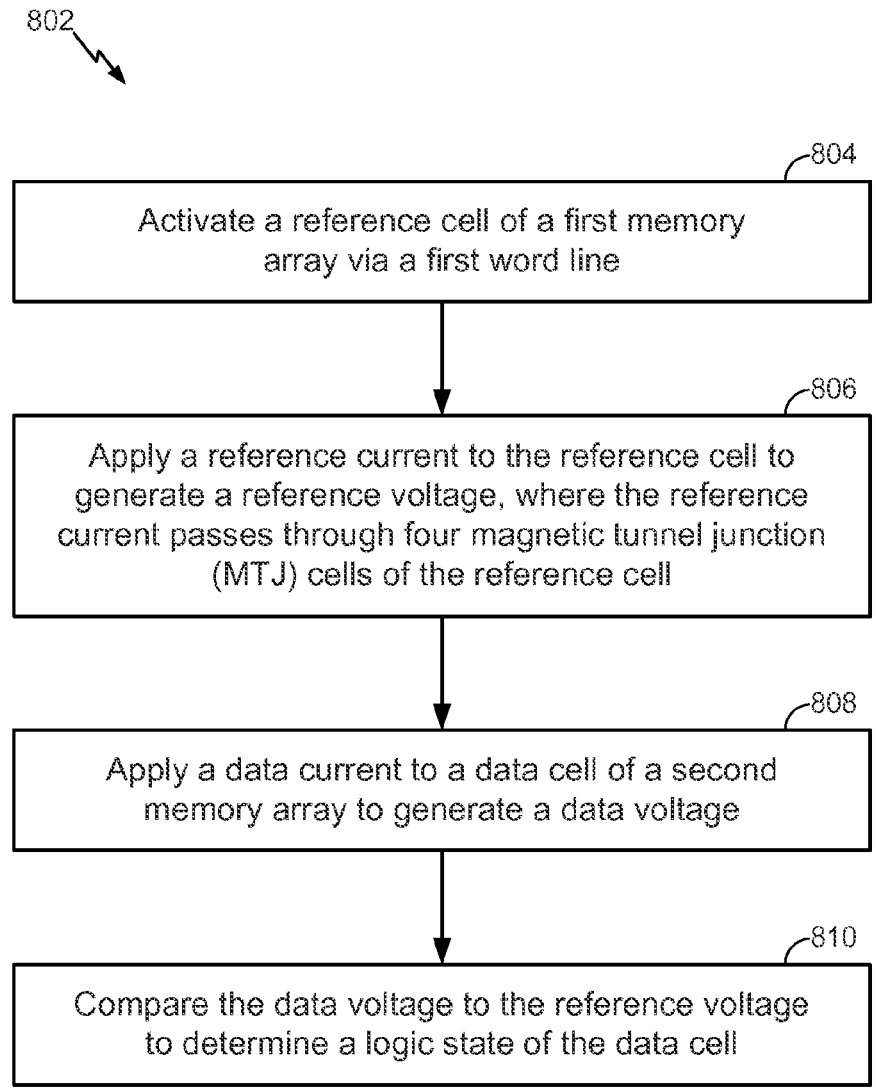
FIG. 8 is a flowchart that illustrates a particular embodiment of a method of operation at a MRAM device that includes a reference cell with four MTJ cells.

FIG. 8 illustrates a particular embodiment of a method 802 of operation at a MRAM device that includes a reference cell with four MTJ cells. The method 802 includes activating a reference cell of a first memory array via a first word line, at 804. For example, referring to FIG. 2, the reference cell 112 may be activated via the reference word line 202 to generate a reference voltage for a sense amplifier to determine a logic state of an MTJ in a particular data column. The method 802 also includes applying a reference current to the reference cell to generate a reference voltage, where the reference current passes through four magnetic tunnel junction (MTJ) cells of the reference cell, at 806. For example, referring to FIG. 2, by passing the reference current I_Ref through the reference cell 112, a reference voltage may be generated, and the reference voltage may be used by the sense amplifier.

In a particular embodiment, the method 802 further includes applying a data current to a data cell of a second memory array to generate a data voltage, at 808. For example, referring to FIG. 2, a data current may be applied to a data cell of a second memory array to generate a data voltage. In another particular embodiment, the method 802 further includes comparing the data voltage to the reference voltage to determine a logic state of the data cell, at 810. For example, referring to FIG. 2, the reference voltage and the data voltage may be compared by a sense amplifier to determine a logic state of the data cell of the second memory array. Thus, the method 802 may provide a reference voltage from a reference cell that has reduced parasitic mismatch and that uses less current to perform a write operation as compared to a conventional resistance mean scheme implementation.

Figure 9:
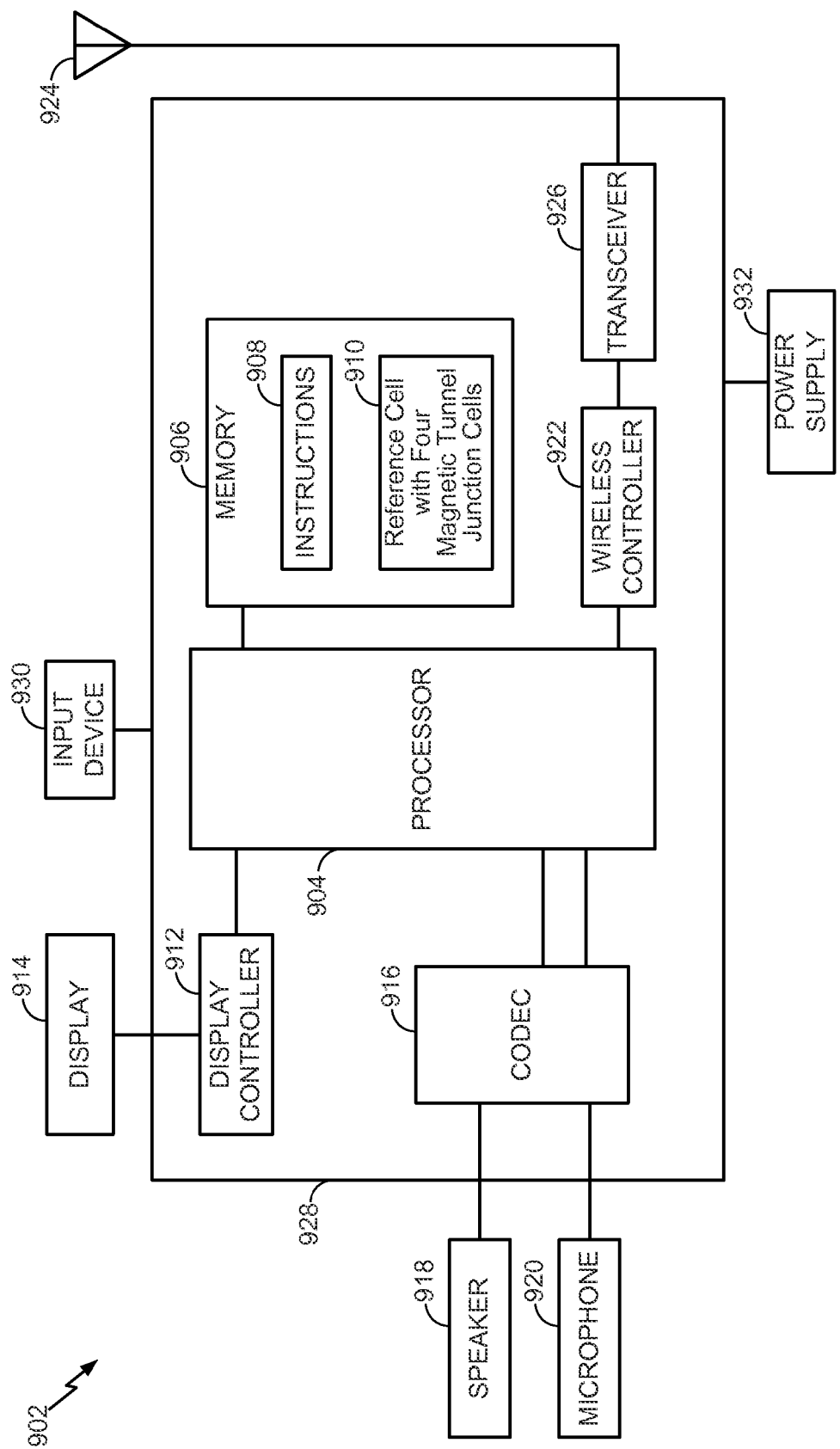
FIG. 9 is a diagram of a particular embodiment of a communication device that includes a MRAM device that includes a reference cell with four MTJ cells.

FIG. 9 is a diagram of a particular embodiment of a communication device 902 that includes a MRAM device (e.g., the MRAM device 102 of FIG. 1 or the MRAM device 502 of FIG. 5) that includes a reference cell (e.g., the reference cell 112, the reference cell 512, or the reference cell 708) with four MTJ cells. In one embodiment, the communication device 802, or components thereof, includes the MRAM device 102 of FIG. 1 or the MRAM device 502 of FIG. 5. Further, the operations/methods described in FIGS. 2-3 and 7-8, or certain portions thereof, may be performed at or by the communication device 902, or components thereof.

The communication device 902 may include a processor 904, such as a digital signal processor (DSP), coupled to a memory 906. The memory 906 may be a non-transitory tangible computer-readable and/or processor-readable storage device that stores instructions 908. The instructions 908 may be executable by the processor 904 to perform one or more functions, such as the operations/methods described with reference to FIGS. 2-3 and 7-8. The memory 906 may be implemented using a MRAM device, such as the MRAM device 102 of FIG. 1 or the MRAM device 502 of FIG. 5.

The memory 906 may also include a reference cell 910, such as the reference cell 112 of FIG. 1, the reference cell 512 of FIG. 5, or the reference cell 708 of FIG. 7. The reference cell 910 may be configured to provide a reference voltage to be used by a sense amplifier (not shown in FIG. 9).

FIG. 9 shows that the communication device 902 may also include a display controller 912 that is coupled to the processor 904 and to a display device 914. A coder/decoder (CODEC) 916 can also be coupled to the processor 904. A speaker 918 and a microphone 920 can be coupled to the CODEC 916. FIG. 9 also indicates that a wireless controller 922 may be coupled to the processor 904, where the wireless controller 922 is in communication with an antenna 924 via a transceiver 926. The wireless controller 922, the transceiver 926, and the antenna 924 may represent a wireless interface that enables wireless communication by the communication device 902. The communication device 902 may include numerous wireless interfaces, where different wireless networks are configured to support different networking technologies or combinations of networking technologies (e.g., Bluetooth low energy, Near-field communication, WiFi, cellular, etc.).

In a particular embodiment, the processor 904, the display controller 912, the memory 906, the CODEC 916, the wireless controller 922, and the transceiver 926 are included in a system-in-package or system-on-chip device 928. In a particular embodiment, an input device 930 and the power supply 932 are coupled to the system-on-chip device 928. Moreover, in a particular embodiment, as illustrated in FIG. 9, the display device 914, the input device 930, the speaker 918, the microphone 920, the antenna 924, and the power supply 932 are external to the system-on-chip device 928. However, each of the display device 914, the input device 930, the speaker 918, the microphone 920, the antenna 924, and the power supply 932 can be coupled to a component of the system-on-chip device 928, such as an interface or a controller.

In conjunction with the described embodiments, an apparatus may include means for storing data. For example, the means for storing data may include the MRAM device 102 of FIG. 1, the MRAM device 502 of FIG. 5, one or more devices configured to store data, or any combination thereof. The apparatus may also include means for providing a reference voltage that is coupled to the means for storing data, where the means for providing a reference voltage includes four magnetic tunnel junction (MTJ) cells. For example, the means for providing a reference voltage may include the reference cell 112 of FIG. 1, the reference cell 512 of FIG. 5, the reference cell 708 of FIG. 7, one or more devices configured to provide a reference voltage using four MTJ cells, or any combination thereof.

Figure 10:
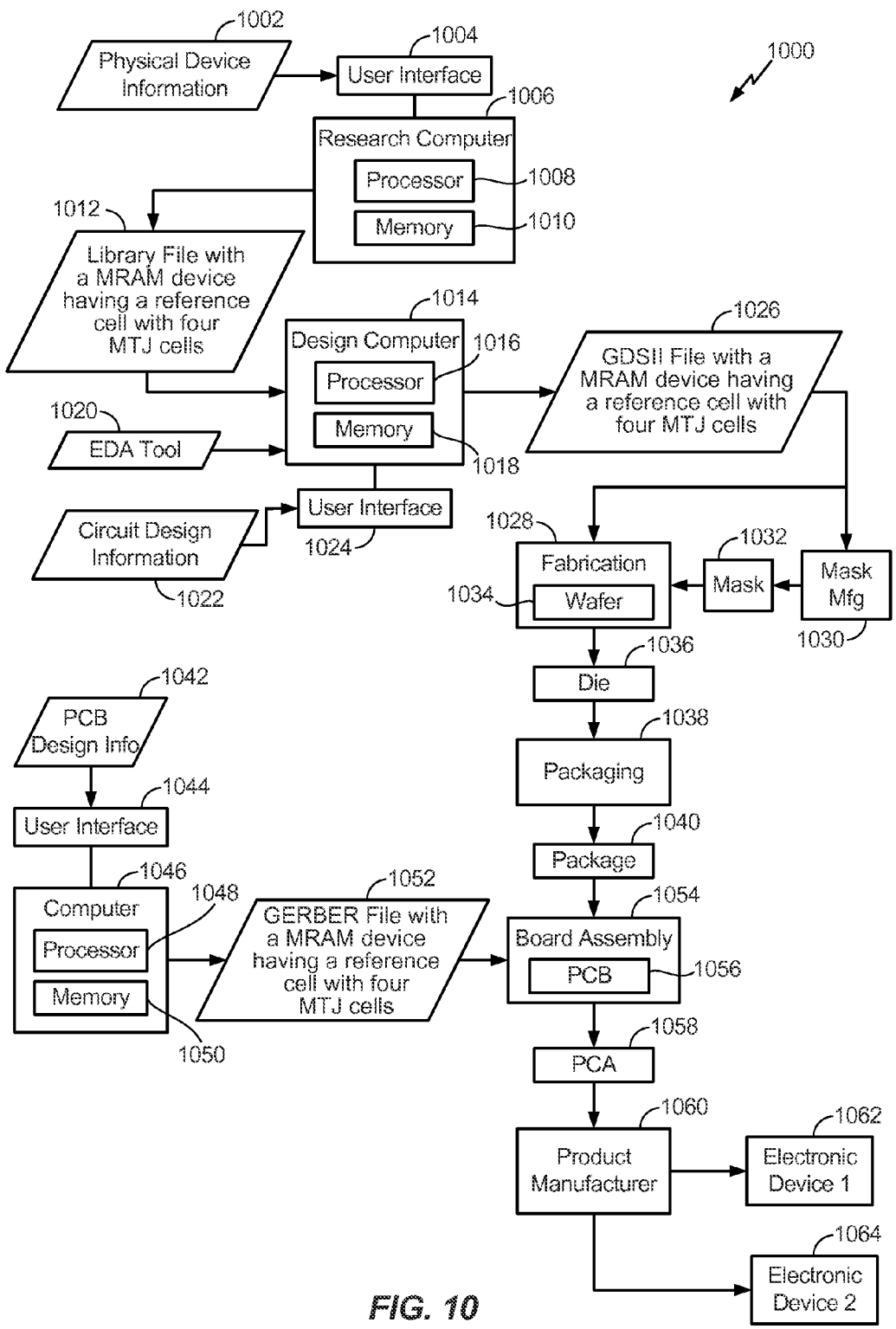
FIG. 10 is a data flow diagram that illustrates a particular illustrative embodiment of a process to manufacture electronic devices that include a MRAM device that includes a reference cell with four MTJ cells.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 10 depicts a particular illustrative embodiment of an electronic device manufacturing process 1000.

Physical device information 1002 is received at the manufacturing process 1000, such as at a research computer 1006. The physical device information 1002 may include design information representing at least one physical property of a semiconductor device, such as the MRAM device 102 of FIG. 1, the MRAM device 502 of FIG. 5, the data column 706 of FIG. 7, the communication device 802 of FIG. 8, or any combination thereof. For example, the physical device information 1002 may include physical parameters, material characteristics, and structure information that is entered via a user interface 1004 coupled to the research computer 1006. The research computer 1006 includes a processor 1008, such as one or more processing cores, coupled to a computer readable medium such as a memory 1010. The memory 1010 may store computer readable instructions that are executable to cause the processor 1008 to transform the physical device information 1002 to comply with a file format and to generate a library file 1012.

In a particular embodiment, the library file 1012 includes at least one data file including the transformed design information. For example, the library file 1012 may include a library of semiconductor devices including a device that includes the MRAM device 102 of FIG. 1, the MRAM device 502 of FIG. 5, the data column 706 of FIG. 7, the communication device 902 of FIG. 9, or any combination thereof, that is provided for use with an electronic design automation (EDA) tool 1020.

The library file 1012 may be used in conjunction with the EDA tool 1020 at a design computer 1014 including a processor 1016, such as one or more processing cores, coupled to a memory 1018. The EDA tool 1020 may be stored as processor executable instructions at the memory 1018 to enable a user of the design computer 1014 to design a circuit including the MRAM device 102 of FIG. 1, the MRAM device 502 of FIG. 5, the data column 706 of FIG. 7, the communication device 902 of FIG. 9, or any combination thereof, of the library file 1012. For example, a user of the design computer 1014 may enter circuit design information 1022 via a user interface 1024 coupled to the design computer 1014. The circuit design information 1022 may include design information representing at least one physical property of a semiconductor device, such as the MRAM device 102 of FIG. 1, the MRAM device 502 of FIG. 5, the data column 706 of FIG. 7, the communication device 902 of FIG. 9, or any combination thereof. To illustrate, the circuit design property may include identification of particular circuits and relationships to other elements in a circuit design, positioning information, feature size information, interconnection information, or other information representing a physical property of a semiconductor device.

The design computer 1014 may be configured to transform the design information, including the circuit design information 1022, to comply with a file format. To illustrate, the file formation may include a database binary file format representing planar geometric shapes, text labels, and other information about a circuit layout in a hierarchical format, such as a Graphic Data System (GDSII) file format. The design computer 1014 may be configured to generate a data file including the transformed design information, such as a GDSII file 1026 that includes information describing the MRAM device 102 of FIG. 1, the MRAM device 502 of FIG. 5, the data column 706 of FIG. 7, the communication device 902 of FIG. 9, or any combination thereof, in addition to other circuits or information. To illustrate, the data file may include information corresponding to a system-on-chip (SOC) that includes the MRAM device 102 of FIG. 1, the MRAM device 502 of FIG. 5, the data column 706 of FIG. 7, the communication device 802 of FIG. 8, or any combination thereof and that also includes additional electronic circuits and components within the SOC.

The GDSII file 1026 may be received at a fabrication process 1028 to manufacture the MRAM device 102 of FIG. 1, the MRAM device 502 of FIG. 5, the data column 706 of FIG. 7, the communication device 902 of FIG. 9, or any combination thereof, according to transformed information in the GDSII file 1026. For example, a device manufacture process may include providing the GDSII file 1026 to a mask manufacturer 1030 to create one or more masks, such as masks to be used with photolithography processing, illustrated as a representative mask 1032. The mask 1032 may be used during the fabrication process to generate one or more wafers 1034, which may be tested and separated into dies, such as a representative die 1036. The die 1036 includes a circuit including a device that includes the MRAM device 102 of FIG. 1, the MRAM device 502 of FIG. 5, the data column 706 of FIG. 7, the communication device 902 of FIG. 9, or any combination thereof.

The die 1036 may be provided to a packaging process 1038 where the die 1036 is incorporated into a representative package 1040. For example, the package 1040 may include the single die 1036 or multiple dies, such as a system-in-package (SiP) arrangement. The package 1040 may be configured to conform to one or more standards or specifications, such as Joint Electron Device Engineering Council (JEDEC) standards.

Information regarding the package 1040 may be distributed to various product designers, such as via a component library stored at a computer 1046. The computer 1046 may include a processor 1048, such as one or more processing cores, coupled to a memory 1050. A printed circuit board (PCB) tool may be stored as processor executable instructions at the memory 1050 to process PCB design information 1042 received from a user of the computer 1046 via a user interface 944. The PCB design information 1042 may include physical positioning information of a packaged semiconductor device on a circuit board, the packaged semiconductor device corresponding to the package 1040 including the MRAM device 102 of FIG. 1, the MRAM device 502 of FIG. 5, the data column 706 of FIG. 7, the communication device 902 of FIG. 9, or any combination thereof.

The computer 1046 may be configured to transform the PCB design information 1042 to generate a data file, such as a GERBER file 1052 with data that includes physical positioning information of a packaged semiconductor device on a circuit board, as well as layout of electrical connections such as traces and vias, where the packaged semiconductor device corresponds to the package 1040 including the MRAM device 102 of FIG. 1, the MRAM device 502 of FIG. 5, the data column 706 of FIG. 7, the communication device 902 of FIG. 9, or any combination thereof. In other embodiments, the data file generated by the transformed PCB design information may have a format other than a GERBER format.

The GERBER file 1052 may be received at a board assembly process 1054 and used to create PCBs, such as a representative PCB 1056, manufactured in accordance with the design information stored within the GERBER file 1052. For example, the GERBER file 1052 may be uploaded to one or more machines to perform various steps of a PCB production process. The PCB 1056 may be populated with electronic components including the package 1040 to form a representative printed circuit assembly (PCA) 1058.

The PCA 1058 may be received at a product manufacture process 1060 and integrated into one or more electronic devices, such as a first representative electronic device 10 and a second representative electronic device 1064. As an illustrative, non-limiting example, the first representative electronic device 1062, the second representative electronic device 1064, or both, may be selected from the group of a set top box, a music player, a video player, an entertainment unit, a navigation device, a communications device, a personal digital assistant (PDA), a fixed location data unit, and a computer, into which the MRAM device 102 of FIG. 1, the MRAM device 502 of FIG. 5, the data column 706 of FIG. 7, the communication device 902 of FIG. 9, or any combination thereof is integrated. As another illustrative, non-limiting example, one or more of the electronic devices 1062 and 1064 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 10 illustrates remote units according to teachings of the disclosure, the disclosure is not limited to these illustrated units. Embodiments of the disclosure may be suitably employed in any device which includes active integrated circuitry including memory and on-chip circuitry.

A device that includes the MRAM device 102 of FIG. 1, the MRAM device 502 of FIG. 5, the data column 706 of FIG. 7, the communication device 902 of FIG. 9, or any combination thereof, may be fabricated, processed, and incorporated into an electronic device, as described in the illustrative process 1000. One or more aspects of the embodiments disclosed with respect to FIGS. 1-9 may be included at various processing stages, such as within the library file 1012, the GDSII file 1026, and the GERBER file 1052, as well as stored at the memory 1010 of the research computer 1006, the memory 1018 of the design computer 1014, the memory 1050 of the computer 1046, the memory of one or more other computers or processors (not shown) used at the various stages, such as at the board assembly process 1054, and also incorporated into one or more other physical embodiments such as the mask 1032, the die 1036, the package 1040, the PCA 1058, other products such as prototype circuits or devices (not shown), or any combination thereof. Although various representative stages of production from a physical device design to a final product are depicted, in other embodiments fewer stages may be used or additional stages may be included. Similarly, the process 1000 may be performed by a single entity or by one or more entities performing various stages of the process 1000.

One or more of the disclosed embodiments may be implemented in a system or an apparatus that includes a portable music player, a personal digital assistant (PDA), a mobile location data unit, a mobile phone, a cellular phone, a computer, a tablet, a portable digital video player, or a portable computer. Additionally, the system or the apparatus may include a communications device, a fixed location data unit, a set top box, an entertainment unit, a navigation device, a monitor, a computer monitor, a television, a tuner, a radio, a satellite radio, a music player, a digital music player, a video player, a digital video player, a digital video disc (DVD) player, a desktop computer, any other device that stores or retrieves data or computer instructions, or a combination thereof. As another illustrative, non-limiting example, the system or the apparatus may include remote units, such as global positioning system (GPS) enabled devices, navigation devices, fixed location data units such as meter reading equipment, or any other electronic device. Although one or more of FIGS. 1-10 illustrate systems, apparatuses, and/or methods according to the teachings of the disclosure, the disclosure is not limited to these illustrated systems, apparatuses, and/or methods. Embodiments of the disclosure may be employed in any device that includes circuitry.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed or that the first element must precede the second element in some manner. Also, unless stated otherwise a set of elements may comprise one or more elements.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

Various illustrative components, blocks, configurations, modules, circuits, and steps may have been described above generally in terms of their functionality. Whether such functionality is implemented as hardware or processor executable instructions depends upon the particular application and design constraints imposed on the overall system. Additionally, the various operations of methods described above (e.g., any operation illustrated in FIGS. 2-3) may be performed by any suitable means capable of performing the operations, such as various hardware and/or processor executable software component(s), circuits, and/or module(s). Skilled artisans may implement the described functionality in varying ways for each particular application, but such implementation decisions should not be interpreted as causing a departure from the scope of the present disclosure.

Those of skill in the art would further appreciate that the various illustrative logical blocks, configurations, modules, circuits, and algorithm steps described in connection with the present disclosure may be implemented or performed with a general purpose processor, a digital signal processor (DSP), an application specific integrated circuit (ASIC), a field programmable gate array (FPGA), a programmable logic device (PLD), discrete gate or transistor logic, discrete hardware components (e.g., electronic hardware), computer software executed by a processor, or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored as one or more computer executable instructions or code on a computer-readable medium. Computer-readable media includes computer readable storage media and communication media including any medium that facilitates transfer of computer program data from one place to another. A storage media may be any available media that can be accessed by a computer. By way of example, and not limitation, such computer readable storage media can include random access memory (RAM), read-only memory (ROM), programmable read-only memory (PROM), erasable PROM (EPROM), electrically erasable PROM (EEPROM), register(s), hard disk, a removable disk, a compact disc read-only memory (CD-ROM), other optical disk storage, magnetic disk storage, magnetic storage devices, or any other medium that can be used to store program code in the form of instructions or data and that can be accessed by a computer. In the alternative, the computer-readable media (e.g., a storage medium) may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and floppy disk where disks usually reproduce data magnetically, while discs reproduce data optically with lasers. Thus, in some aspects computer readable medium may include a non-transitory computer readable medium (e.g., tangible media). Combinations of the above should also be included within the scope of computer-readable media.

The methods disclosed herein include one or more steps or actions. The method steps and/or actions may be interchanged with one another without departing from the scope of the claims. In other words, unless a specific order of steps or actions is specified, the order and/or use of specific steps and/or actions may be modified without departing from the scope of the disclosure.

Certain aspects may include a computer program product for performing the operations presented herein. For example, a computer program product may include a computer-readable storage medium having instructions stored (and/or encoded) thereon, the instructions being executable by one or more processors to perform the operations described herein. The computer program product may include packaging material.

Further, it should be appreciated that modules and/or other appropriate means for performing the methods and techniques described herein can be downloaded and/or otherwise obtained by a user terminal and/or base station as applicable. Alternatively, various methods described herein can be provided via storage means (e.g., RAM, ROM, or a physical storage medium such as a compact disc (CD)). Moreover, any other suitable technique for providing the methods and techniques described herein can be utilized. It is to be understood that the scope of the disclosure is not limited to the precise configuration and components illustrated above.

The previous description of the disclosed embodiments is provided to enable a person skilled in the art to make or use the disclosed embodiments. While the foregoing is directed to aspects of the present disclosure, other aspects of the disclosure may be devised without departing from the basic scope thereof, and the scope is determined by the claims that follow. Various modifications, changes and variations may be made in the arrangement, operation, and details of the embodiments described herein without departing from the scope of the disclosure or the claims. Thus, the present disclosure is not intended to be limited to the embodiments herein but is to be accorded the widest scope possible consistent with the principles and novel features as defined by the following claims and equivalents thereof.

What is claimed is:

1. An apparatus comprising:
   a group of data cells that includes a plurality of columns of data cells;

a first source line driver coupled via a first source line to a first column of data cells of the plurality of columns of data cells and coupled via a fourth source line to a fourth column of data cells of the plurality of columns of data cells;

a second source line driver coupled via a second source line to a second column of data cells of the plurality of columns of data cells and coupled via a third source line to a third column of data cells of the plurality of columns of data cells; and a reference cell coupled to the group of data cells, wherein the reference cell comprises four magnetic tunnel junction (MTJ) cells.

2. The apparatus of claim 1, wherein each of the four MTJ cells comprises an MTJ element coupled to a single transistor.

3. The apparatus of claim 1, wherein the group of data cells further comprises a plurality of data cells coupled to bit lines, and wherein only one of the bit lines is coupled to the reference cell.

4. The apparatus of claim 1, wherein each of the four MTJ cells is aligned with a distinct column of the plurality of columns of data cells.

5. The apparatus of claim 3, wherein a first bit line is coupled to the reference cell, wherein a first MTJ cell of the four MTJ cells is coupled to the first bit line, wherein a second MTJ cell of the four MTJ cells is coupled to the first MTJ cell via a first connection, wherein a third MTJ cell of the four MTJ cells is coupled to the second MTJ cell via a second connection, and wherein a fourth MTJ cell of the four MTJ cells is coupled to the first MTJ cell via a third connection and is coupled to the third MTJ cell via a fourth connection.

6. The apparatus of claim 1, wherein MTJs of the group of data cells have substantially the same structure as MTJs of the reference cell.

7. The apparatus of claim 6, wherein the group of data cells and the reference cell are implemented using MTJ cells that each comprises a single MTJ element coupled to a single transistor.

8. The apparatus of claim 6, wherein the group of data cells and the reference cell are implemented using MTJ cells that each comprises a single MTJ element coupled to two transistors.

9. The apparatus of claim 1, wherein the reference cell is configured to provide a resistance value according to a resistance mean reference scheme.

10. The apparatus of claim 1, further comprising:
a bit line selector coupled to the group of data cells;
a source line selector coupled to the reference cell, wherein the source line selector is located closer to the reference cell than the bit line selector; and
a voltage source, wherein the first column of data cells and the fourth column of data cells are disposed between the voltage source and the first source line driver, and wherein the second column of data cells and the third column of data cells are disposed between the voltage source and the second source line driver.

11. The apparatus of claim 1, further comprising a device selected from one of a set top box, a music player, a video player, an entertainment unit, a navigation device, a communications device, a personal digital assistant (PDA), a fixed location data unit, or a computer, into which the reference cell is integrated.

12. The apparatus of claim 1, wherein:
a first MTJ element of a first MTJ cell is connected in series between a first node and a first transistor;
a second MTJ element of a second MTJ cell is connected in series between the first transistor and a second transistor that is connected to a second node;
a third MTJ element of a third MTJ cell is connected in series between the first node and a third transistor; and
a fourth MTJ element of a fourth MTJ cell is connected in series between the third transistor and a fourth transistor that is connected to a third node.

13. The apparatus of claim 12, wherein a fifth transistor is coupled in parallel with the first transistor, a sixth transistor is coupled in parallel with the second transistor, a seventh transistor is coupled in parallel with the third transistor, and an eight transistor is coupled in parallel with the fourth transistor.

14. The apparatus of claim 12, wherein the second node is coupled to the third node.

15. The apparatus of claim 12, where the group of data cells further comprises a plurality of data cells coupled to bit lines, wherein one of the bit lines is coupled to the reference cell, and wherein a first bit line is coupled via the first node to the reference cell.

16. A method comprising:
activating a reference cell of a first memory array via a first word line;
applying a reference current to the reference cell to generate a reference voltage, wherein the reference current passes through four magnetic tunnel junction (MTJ) cells of the reference cell;
applying a first voltage to the reference cell via a first source line driver to program a first MTJ cell of the reference cell and a fourth MTJ cell of the reference cell; and
applying a second voltage to the reference cell via a second source line driver to program a second MTJ cell of the reference cell and a third MTJ cell of the reference cell.

17. The method of claim 16, further comprising:
applying a data current to a data cell of a second memory array to generate a data voltage; and
comparing the data voltage to the reference voltage to determine a logic state of the data cell.

18. The method of claim 16, wherein the reference cell is configured to provide a resistance value according to a resistance mean reference scheme.

19. The method of claim 18, wherein providing the resistance value according to the resistance mean reference scheme includes generating the resistance value as an average of a first resistance value that corresponds to a first logic state and a second resistance value that corresponds to a second logic state.

20. The method of claim 16, wherein the first MTJ cell and the fourth MTJ cell are programmed to store a first logic state, and wherein the second MTJ cell and the third MTJ cell are programmed to store a second logic state.

21. The method of claim 20, wherein the first logic state is different than the second logic state.

22. The method of claim 16, wherein activating the reference cell of the first memory array via the first word line is performed by a processor integrated into an electronic device.

23. An apparatus comprising:
a plurality of means for storing data, wherein a first means for storing data of the plurality of means for storing data is coupled via a first source line to a first source line driver, a second means for storing data of the plurality of means for storing data is coupled via a second source line to a second source line driver, a third means for storing data of the plurality of means for storing data is coupled via a third source line to the second source line driver, and a fourth means for storing data of the plurality of means for storing data is coupled via a fourth source line to the first source line driver; and means for providing a reference voltage that is coupled to the means for storing data, wherein the means for providing the reference voltage includes four magnetic tunnel junction (MTJ) cells.

24. The apparatus of claim 23, further comprising a device selected from one of a set top box, a music player, a video player, an entertainment unit, a navigation device, a communications device, a personal digital assistant (PDA), a fixed location data unit, or a computer, into which the means for providing the reference voltage is integrated.

25. A non-transitory computer readable storage device storing instructions that are executable by a processor to perform operations comprising:
   activating a reference cell of a first memory array that includes a plurality of columns of data cells via a first word line, wherein:
      a first column of data cells of the plurality of columns of data cells is coupled via a first source line to a first source line driver,
      a second column of data cells of the plurality of columns of data cells is coupled via a second source line to a second source line driver,
      a third column of data cells of the plurality of columns of data cells is coupled via a third source line to the second source line driver, and
      a fourth column of data cells of the plurality of columns of data cells is coupled via a fourth source line to the first source line driver; and
   applying a reference current to the reference cell to generate a reference voltage, wherein the reference current passes through four magnetic tunnel junction (MTJ) cells of the reference cell.

26. The non-transitory computer readable storage device of claim 25, wherein the instructions are executable by the processor integrated in a device selected from one of a set top box, a music player, a video player, an entertainment unit, a navigation device, a communications device, a personal digital assistant (PDA), a fixed location data unit, or a computer.

27. A method comprising:
   a first step for activating a reference cell of a first memory array via a first word line;
   a second step for applying a reference current to the reference cell to generate a reference voltage, wherein the reference current passes through four magnetic tunnel junction (MTJ) cells of the reference cell;
   a third step for applying a first voltage to the reference cell via a first source line driver to program a first MTJ cell of the reference cell and a fourth MTJ cell of the reference cell; and
   a fourth step for applying a second voltage to the reference cell via a second source line driver to program a second MTJ cell of the reference cell and a third MTJ cell of the reference cell.

28. The method of claim 27, wherein the first step and the second step are performed by a processor integrated into an electronic device.

29. A method comprising:
   receiving, at a computing device, design information comprising physical positioning information of a packaged semiconductor device on a circuit board, the packaged semiconductor device comprising:
      a group of data cells that includes a plurality of columns of data cells;
      a first source line driver coupled via a first source line to a first column of data cells of the plurality of columns of data cells and coupled via a fourth source line to a fourth column of data cells of the plurality of columns of data cells;
      a second source line driver coupled via a second source line to a second column of data cells of the plurality of columns of data cells and coupled via a third source line to a third column of data cells of the plurality of columns of data cells; and
      a reference cell coupled to the group of data cells, wherein the reference cell comprises four magnetic tunnel junction (MTJ) cells; and
   transforming, at the computing device, the design information to generate a data file.

30. The method of claim 29, wherein the data file has a GERBER format.

31. The method of claim 29, wherein the data file includes a GDSII format.

* * * * *